US012696416B2

(12) United States Patent  
Kartadinata et al.

(10) Patent No.:  US 12,696,416 B2  
(45) Date of Patent:  Jul. 28, 2026

(54) INFORMATION PROCESSING DEVICE WITH AIRFLOW OPENINGS IN SEPARATOR WALL BETWEEN CENTRAL BAY AND SIDE BAY

(71) Applicant: HEWLETT PACKARD ENTERPRISE DEVELOPMENT LP, Spring, TX (US)

(72) Inventors: Warren Antonio Kartadinata, Castro Valley, CA (US); Vance Brey Murakami, Los Gatos, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 119 days.

(21) Appl. No.: 18/918,248

(22) Filed: Oct. 17, 2024

(65) Prior Publication Data

US 2026/0113860 A1     Apr. 23, 2026

(51) Int. Cl.  
*H05K 7/14* (2006.01)  
*H05K 5/02* (2006.01)  
*H05K 7/20* (2006.01)

(52) U.S. Cl.  
CPC ......... *H05K 7/1487* (2013.01); *H05K 5/0213* (2013.01); *H05K 7/1489* (2013.01); *H05K 7/20172* (2013.01)

(58) Field of Classification Search  
None  
See application file for complete search history.

(56) References Cited

U.S. PATENT DOCUMENTS

| | | | |
|---|---|---|---|
| 6,151,213 A | 11/2000 | Ater et al. | |
| 6,542,363 B2 | 4/2003 | White | |
| 6,771,499 B2 | 8/2004 | Crippen et al. | |
| 7,817,430 B2 | 10/2010 | Sherrod et al. | |
| 8,514,571 B2* | 8/2013 | Ji | H05K 7/20572 |
| | | | 361/679.48 |
| 8,988,877 B2 | 3/2015 | Cash et al. | |
| 10,433,451 B1* | 10/2019 | Wang | H05K 7/1417 |
| 11,259,437 B2* | 2/2022 | Wang | H05K 5/03 |
| 11,812,575 B2* | 11/2023 | Wang | H05K 5/03 |
| 12,402,266 B2* | 8/2025 | Wu | H05K 7/1487 |
| 2012/0236490 A1* | 9/2012 | Xia | G06F 1/187 |
| | | | 361/679.33 |
| 2017/0042061 A1 | 2/2017 | Chen et al. | |

(Continued)

*Primary Examiner* — Xanthia C Relford  
(74) *Attorney, Agent, or Firm* — Jones Burke, PLLC

(57)     ABSTRACT

An information processing system comprises a chassis with central bays to removably receive system board modules (e.g., input-output-modules IOMs) and side bays to removably receive side modules (e.g., remote monitoring and management RMM modules). Each side bay sits between the central bays and one of the side walls of the chassis. A separator wall separates the central bay(s) from an adjacent side bay. This separator wall has one or more pairs of airflow openings that fluidically connect the adjacent side bay to the central bay. Sliding doors may be disposed on the separator wall adjacent these openings, with each sliding door being movable between a closed position, covering the opening, and an open position, not covering the opening. The doors may be passively actuated between the open and closed positions by insertion or removal of the system board modules into the central bays.

20 Claims, 10 Drawing Sheets

(56)               References Cited

U.S. PATENT DOCUMENTS

2017/0332512 A1 *   11/2017  Potter .................. H05K 7/1402
2022/0183188 A1 *   6/2022  Lee .................... H05K 7/20145
2024/0373579 A1 *   11/2024  Olesiewicz .......... H05K 7/1401
2025/0247990 A1 *   7/2025  Utz ......................... G06F 1/181

* cited by examiner

INFORMATION PROCESSING DEVICE WITH AIRFLOW OPENINGS IN SEPARATOR WALL BETWEEN CENTRAL BAY AND SIDE BAY

INTRODUCTION

Information processing systems, such as servers and networking devices, often have one or more system boards (e.g., motherboards), peripheral components connected to the system boards, and a chassis to support and house the various components. In some cases, the chassis may include bays to removably receive certain pluggable modules, such as storage drives. Fans are often disposed in the chassis to cool the system.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings:

Figure 1:
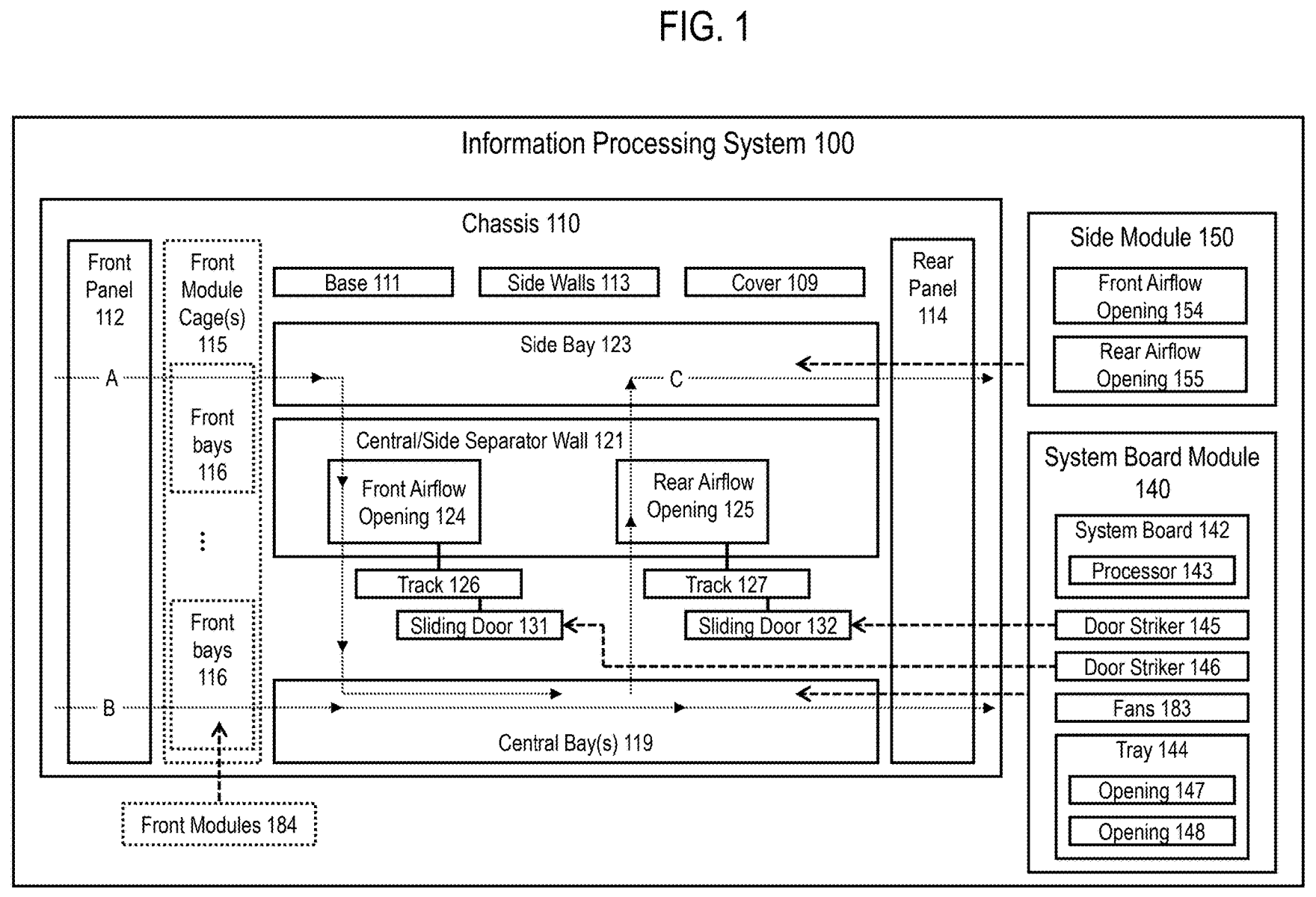

FIG. 1 is a block diagram illustrating an example information processing system.

DETAILED DESCRIPTION

Figure 2:
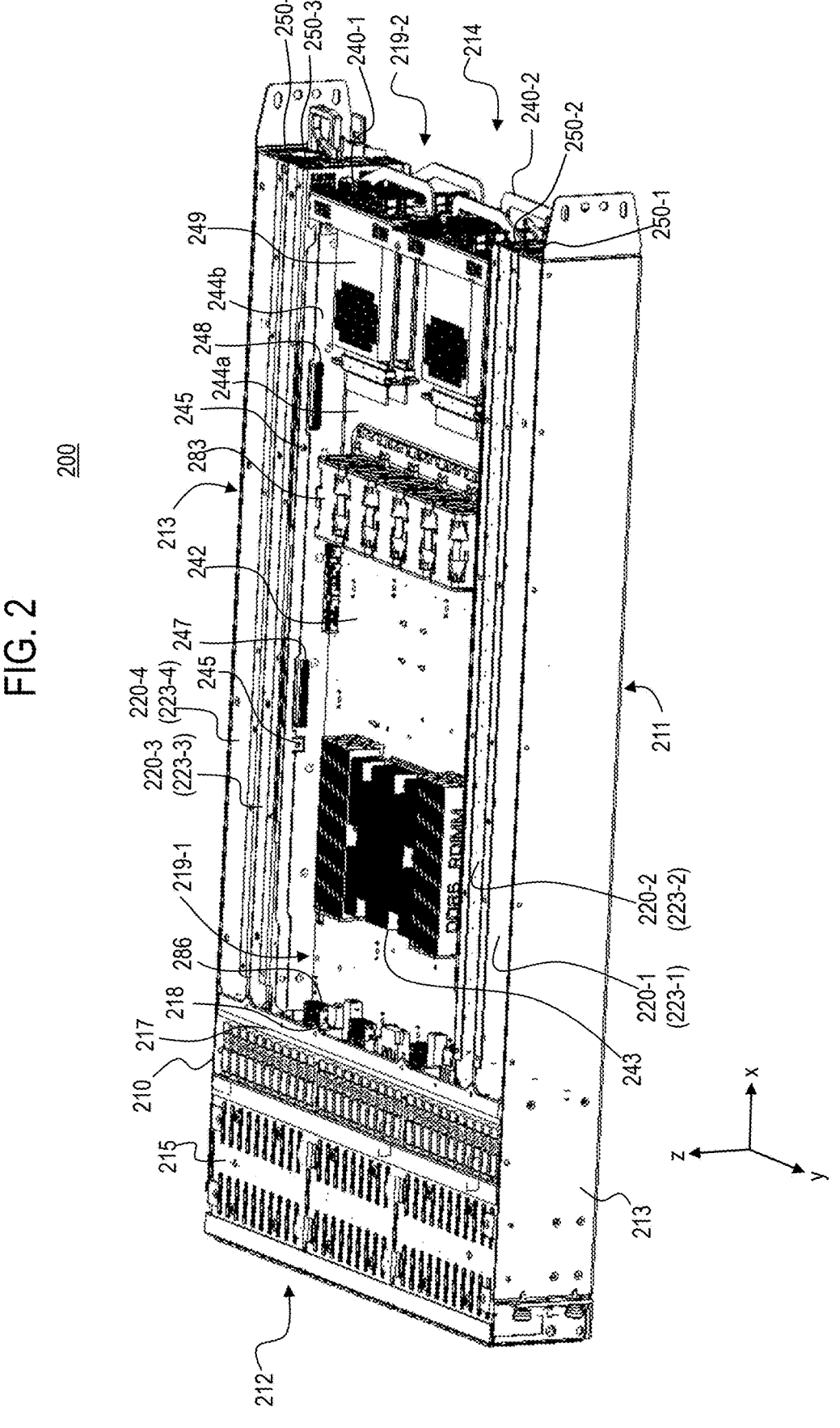
FIG. 2 is a perspective view of another example information processing system with a chassis cover omitted from view.

In many compute-focused servers, various pluggable module bays are disposed at the front of the system and/or the rear of the system. The system board is often disposed in a middle region of the chassis, often extending in a width-wise direction across the full width of the chassis, and the system board is often fixedly mounted to the chassis in this position. Fans of the system are generally arranged in a line positioned in front or behind the system board, with the line of fans often extending across the full width of the chassis to allow for airflow over all portions of the system board.

However, some systems, such as certain data-storage focused servers, may have internal layouts different than the common compute-server layout described above. In particular, in some systems, instead of pluggable module bays being limited to the front panel or rear panel, there may also be one or more customized module bays which extend beyond the front or rear portions of the chassis and which are located between the system board and a side wall of the chassis. These bays may be referred to herein as "side bays" or "side module bays" because they run along the side of the system board, as opposed to being in front of or to the rear of the system board. Such side bays may be used to house special purpose modules, such as large power supply units (PSUs), Remote Monitoring and Management (RMM) Modules, or other modules. In systems that have such side bays, the system board usually does not extend fully across the width of the system because the one or more side bays occupy the space between the system board and the side wall.

Furthermore, in some systems, the system board may itself be part of a removable module which is removably installable in a bay in the chassis, rather than being fixedly attached to the chassis. For example, in some data storage systems, one or more processor nodes may be provided as removable modules, referred to herein as input-output-modules (IOMs), which are removably installable in a bay in the chassis. In systems which use such removable IOMs and which also have side module bays, the removable IOMs may be installed in one or more central bays with the side modules sitting between the central bay(s) and a side wall of the chassis.

Systems having side module bays can be challenging to cool, as it may not be feasible to use the fan placements and airflow patterns often found in standard compute-focused systems. For example, in some systems with side bays, fans cannot be distributed across a full width of the system chassis, due to the side bays being in the way. Instead, the primary fans are often limited to being disposed in the central bay(s). For example, in some systems which have removable IOMs, each IOM may have a set of fans included as part of the module.

But this center-bay focused fan arrangement creates some unique challenges. For example, components located outside of the central bay, such as the modules disposed in the side bays, may not receive cooling airflows because the fans are in the central bay. While it may sometimes be possible to provide a side bay with its own secondary fans to provide cooling airflows therethrough, in some cases this is not possible or desirable. For example, some side bays may be too narrow to allow for a suitable fan to be installed. In other cases, it may be possible to provide a fan or blower, but due to size or other constraints the fan or blower may not be able to provide enough airflow, on its own, to cool the side module components to a desired degree.

Furthermore, in some cases the arrangement of the central module bay with side module bays disposed adjacent thereto can result in decreased cooling efficiency in the central bay, despite the primary fans being concentrated in the central bay. This may be the case because the area through which the fans in the central bay are able to draw air into the system (the "air intake area") may be reduced as compared to a system in which there are no side bays. In a system with no side bays, the fans extend fully across the width of the chassis and therefore the entire front panel provides the air intake for the fans. On the other hand, in a system with side bays, the central bay does not extend across the full width of the chassis, and therefore only a portion of the front panel (i.e., the portion directly in front of the central bay) provides air intake directly to the central bay. Thus, even if the same number of fans were provided in the central bay as compared to in a system without the side modules bays, the fans in the central bay may move less air per unit of time at a given fan speed because they have a smaller air intake area. Put another way, the fans in the central bay see a higher airflow impedance due to having a smaller airflow intake, and therefore these fans may need to run at a higher speed in order to move the same amount of air. This consumes more energy and increases the noise output of the system.

To address these and other issues, in examples disclosed herein at least one pair of airflow openings is provided in a separator wall which separates a side module bay from a central bay. These airflow openings are arranged to allow air to flow from the side bay into the central bay and then back from the central bay into the side bay. This can allow for cooling of the side modules even if those side modules do not have their own secondary fans, while simultaneously increasing the amount of airflow which can pass through portions of the central bay at a given fan speed. Thus, the airflow openings may help ensure that all components in the system receive adequate cooling while also allowing the fans to run at lower speeds, consuming less power and generating less noise.

More specifically, each pair of airflow openings may include a front airflow opening which is located forward (upstream) of the fans and a rear airflow opening which is located rearward (downstream) of the fans. The front opening may allow the fans in the central bay to pull air from the side bay into the central bay. The rear opening allows some of the air from the central bay, after having cooled some components of the central bay, to return to the side bay. This arrangement can allow the side module to be cooled, even if it lacks a fan. This arrangement can also improve the cooling efficiency of the components in the central bay, as will be explained below.

The pulling of air from the side bay into the central bay via the front opening increases the total amount of air moved through at least some portions of the central bay, thus improving the cooling efficiency of at least some components in the central bay. Another way to think of it is that the total area of the front panel which can supply air intake to the central bay is effectively increased, as the intake area now includes not only the portion directly in front of the central bay but also the portion which is in front of the side panel, and this increase in air intake area can allow the fans to move a greater volume of air per unit time through the central bay at a given fan speed.

In addition, before the air leaves the side bay via the front airflow opening, it will pass over the forward-most portions of the side module, and thus any components in this front portion of the side module will receive cooling from this airflow. Similarly, the components located in a rear portion of the side module will also receive cooling from the air which is returned from the central bay back into the side module via the rear airflow opening. In some examples, the components of the side module which primarily need cooling can be concentrated at the front and at the rear of the side module, while the middle region of the module can be arranged such that it does not need much if any active cooling. Accordingly, flowing air over only the front portion and the rear portion of the side module, such as occurs when using the airflow openings described above, can be enough, in some circumstances, to adequately cool the side module.

The ability to cool the side module bays using airflows driven by the central bay fans, via the front and rear airflow openings, may allow for fans to be omitted from the side module. This can allow the side module to receive cooling even in situations where it would be infeasible to place a fan in the side bay. Furthermore, even in systems where it would be possible to add a fan in the side bay, it may be desired to omit such a fan to reduce costs and complexity, and the airflow openings may allow this omission to be possible. Furthermore, even in systems in which a fan is present in the side module, in some cases that fan might not provide as much cooling as may be desired, in which case providing the airflow openings can help to supplement the cooling of the side bay (the fan in the side bay may produce less cooling than is desired because, for example, space constraints in the bay may result in the fan being smaller and less powerful than may be desired).

In some examples in which the side modules which are to be disposed in the side bays might block the airflow openings in the separator wall, the side modules may also be provided with corresponding airflow openings (e.g., through a wall of a module enclosure and/or through a module PCB). These airflow openings in the side module align with the corresponding airflow openings of the separator wall such that the side module does not block air through the airflow opening of the separator wall.

While the airflow openings can provide a number of benefits, such as those described above, they can also introduce some side effects. In some systems it may be possible to operate the system in a configuration in which no central modules are present. In such systems, secondary fans may be provided in the side modules to ensure that they can still receive cooling when no central modules are present. But in such a scenario, because there is no central module present, the airflow openings may allow for air recirculation to occur through the fan of the side module. That is, heated air which has been expelled from the fan may get pulled through the rear airflow opening into the empty central bay, circulate forward through the central bay, pass through the front opening back into the side bay, and get drawn back through the fan again. This recirculation of already heated air reduces the amount of fresh cool air which is drawn through the fan, thus decreasing the cooling efficiency. Thus, while the airflow openings from the side bay into the central bay can improve cooling efficiency when a central module is present in the central bay, they can hurt cooling efficiency when no central modules are present in the central bay.

Accordingly, to address these potential side effects of the airflow openings, some examples disclosed herein may provide actuatable doors which can selectively cover or uncover the airflow openings between the side bay and the central bay. Moreover, these doors may be passively actuatable by the insertion and removal of central modules (e.g., an IOM) into the central bay. Passively actuated means that the actuation does not require use of a powered actuation mechanism or a user to manually interact directly with the doors or drive a, but instead the doors are automatically actuated by the central module as a result of the central module being inserted into or removed from the central module bay.

In some examples, each actuatable door may be movably connected, via a bracket, to one of the separator walls in which one or more of the airflow openings are provided. The bracket comprises a set of horizontal tracks that support the door and also guide the door in translation between a closed position and an open position. In the closed position, the door substantially covers one of the airflow openings in the separator wall so as to substantially prevent airflow through the airflow opening. In the open position the airflow opening is substantially open such that airflow is allowed through the airflow opening. A striker attached to the central module engages with a self-release latch of the door as the central module is moved into or out of the central bay, thereby automatically moving the door between the open and closed positions in response to insertion/removal of the central module.

These and other examples will be described in greater detail below in relation to FIGS. 1-15.

FIG. 1 illustrates an example information processing system 100. FIG. 1 is schematic in nature and is not intended to illustrate shapes, sizes, spatial relationships, or other structural details accurately or to scale, unless otherwise noted herein. Components which are not illustrated in FIG. 1 may also be included in some examples disclosed herein, or one or more components illustrated in FIG. 1 may be omitted from some examples disclosed herein. In FIG. 1, solid lines extending between blocks indicate permanent or semi-permanent attachment/coupling between the components represented by the blocks, dashed-line arrows extending between blocks indicate a removable or transient engagement between the components represented by the blocks, and dotted-line arrows indicate airflow paths.

The information processing system 100 may be server, networking device, or other information processing system. The system 100 comprises a chassis 110 having one or more central module bays 119 ("central bay 119") and one or more side module bays 123 ("side bays 123"), one or more system board modules 140, and one or more side modules 150.

The chassis 110 comprises an enclosure which houses and supports the other components of the system 100, as well as various internal support structures inside the enclosure. For example, the chassis 110 is formed from a base 111, a front panel 112, a rear panel 114, a top cover 109, and two side walls 113, which together form a housing/enclosure of the system 100, as is familiar to those of ordinary skill in the art. The front panel 112, rear panel 114, and side walls 113 are all perpendicular to the base 111. The top cover 109 is parallel to the base 111 and may be fully or partially removable or openable to allow access to the interior of the chassis 110. The front panel 112 and rear panel 114 are disposed opposite one another, with the two side walls 113 being perpendicular to and extending between the front panel 112 and the rear panel 114. The front panel 112 and the rear panel 114 may include airflow openings (e.g., perforations, slots, etc.) to allow airflow through the chassis 110, as well as electrical connectors or other ports.

In addition, in some examples, one or more front module cages 115 comprising front bays 116 may be provided at the front panel 112, which may removably receive pluggable front modules 184 (e.g., pluggable storage drives). In some examples which comprise such front module cages 115, portions of these cages 115 and or the removable front modules 184 installed therein may become part of the front panel 112. Thus, the front panel 112 is not necessarily formed from a single monolithic structure.

As mentioned, the chassis 110 also includes one or more central bays 119 and one or more side bays 123 (only one of each is shown in FIG. 1 to simplify the drawings). Each central bay 119 is configured to removably receive a system board module 140, and each side bay 123 is configured to removably receive a side module 150. These bays 119 and 123 will be described in greater detail below after description of the modules 140 and 150.

The system board module 140 comprises a system board 142 together with a support structure to support the system board 142, the support structure comprising at least a tray 144. The system board 142 comprises a processor 143, as well as other electronic components. In some examples, the system board 142 comprises a motherboard, host-processor module (HPM), storage controller node, or other type of primary system board. In some examples, the system board module 140 comprises an input-output-module (IOM). The tray 144 is configured to be removably received in one of the central bay(s) 119, and may include engagement features to engage with complementary engagement features in the central bay 119 to guide the module 140 into the bay 119 and to support the module 140 within the bay 119.

In some examples, the tray 144 of the system board module 140 may include a base and side walls connected perpendicularly to the base. In examples in which the tray 144 includes side walls, one or both side walls may include front and rear airflow openings 147 and 148 which are configured to align with front and rear airflow openings 124 and 125.

The system board module 140 may also comprise a set of fans 183. These fans may be mounted to the tray 144. In some examples, the fans 183 may comprise the primary fans of the system 100. The system board module 140 also comprises a door striker 145 and a door striker 146, which will be described in greater detail below.

The side module 150 comprises a removable pluggable module, such as a RMM module, a PSU module, or another pluggable module. The side module 150 may include a PCB (not illustrated) with one or more electronic components mounted thereto. The side module 150 may also include, in some examples, a front airflow opening 154 and a rear airflow opening 155, which are described below.

The central bay(s) 119 is (are) arranged in a central portion of the chassis 110, whereas the side bays 123 are arranged laterally alongside the central bay(s) 119, with each side bay 123 being positioned between the central bay(s) 119 and one of the side walls 113. In examples where there are multiple central bays 119, they may be vertically stacked atop one another and may have similar front-to-rear and lateral dimensions as one another. In some cases in which multiple of the side bays 123 are present, they may be positioned on both lateral sides of the central bay(s) 119, i.e., with at least one side bay 123 on one lateral side of the central bay(s) 119 and at least one other side bay 123 on an opposite lateral side of the central bay(s) 119. In some examples, the central bay(s) 119 and side bay(s) 123 extend a same distance as one another along the front-to-rear dimensions. In some examples, the central bay(s) 119 and side bay(s) 123 are arranged to receive the modules 140 or 150 through the rear panel 114, via openings in the rear panel 114. In some examples, the central bay(s) 119 and side bay(s) 123 extend from the rear panel 114 forward to the front module cages 115—in other words, in some examples, the central bay(s) 119 and side bay(s) 123 extend along nearly the full length of the chassis 110 except for the portion occupied by the front module cages 115.

The central bay 119 and the side module bays 123 are defined, in part, by one or more vertical walls extending parallel to the side walls 113, including at least one or more central/side separator walls 121. Each central/side separator wall 121 is oriented vertically (i.e., perpendicular to the base 111) and separates the central bay(s) 119 from an immediately adjoining side bay 123. In examples where the system 100 has side bays 123 disposed on both lateral sides of the central bay(s) 119, the central bay(s) 119 are defined in the space between a pair of the central/side separator wall 121. In examples where side bay(s) 123 are disposed along only one lateral side of the central bay 119, the central bay 119 may be defined in the space between one central/side separator wall 121 and one side wall 113.

The side bays 123 are defined between a pair of vertical walls. For the side bays 123 which are immediately adjacent to the central bay 119, these vertical walls which define the side bay 123 include the central/side separator walls 121. For side bays 123 which are immediately adjacent to the side walls 113, these vertical walls which define the side bay 123 may include the side wall 113 itself. In examples in which there are multiple side bays 123 disposed between the central bay 119 and a side wall 113, additional vertical separator walls (not illustrated) may separate one side bay 123 from an adjoining side bay 123.

For example, in some implementations, the system 100 comprises two side bays 123, one disposed on either lateral side of the central bay 119. In such an example, there are two central/side separator walls 121 with the central bay 119 defined between these two walls 121, and each side bay 123 may be defined between one of these central/side separator walls 121 and one of the side walls 113. In other words, if one moves laterally across the chassis 110 starting at a first side wall 113, then one would first cross a first side bay 123, then reach a central/side separator wall 121, then cross through the central bay 119, then reach the other central/side separator wall 121, then cross through the other side bay 123, and finally reach the other side wall 113.

As another example, in some implementations, the system 100 comprises four side bays 123, two disposed on either lateral side of the central bay 119. In other words, there is an innermost pair of side bays 123 which are closest to the central bay 119 and an outermost pair of side bays 123 which are farther from the central bay 119. In this case, the central bay 119 is defined between a pair of central/side separator walls 121, like in the previous example. For the two innermost side module bays 123, each would be defined between one of central/side separator walls 121 and an additional vertical separator wall which separates the innermost side module bays 123 from the outermost side module bays 123. The outermost side module bays 123 would be defined between the additional vertical separator walls and the side walls 113. In other words, if one moves laterally across the chassis 110 starting at a first side wall 113, then one would first cross a first side bay 123, then reach a first vertical separator wall, then cross a second side bay 123, then reach a central/side separator wall 121, then cross through the central bay 119, then reach the other central/side separator wall 121, then cross through a third side bay 123, then reach a second vertical separator wall, then cross through a fourth side bay 123, and finally reach the other side wall 113.

Other configurations with different numbers or arrangements of side bays 123 are possible, but in all of these cases at least one of the side bays 123 is immediately adjacent to the central bay 119, and that adjacent side bay 123 is separated from the central bay 119 by a central/side separator wall 121. Furthermore, other side bays 123 which are not immediately adjacent to the central bay 119 may be separated from other side bays 123 by other vertical separator walls.

As shown in FIG. 1 the central/side separator wall 121 comprises at least one pair of airflow openings 124/125, including a front airflow opening 124 and a rear airflow opening 125. In examples with multiple central/side separator walls 121, each central/side separator walls 121 may include one or more pairs of the airflow openings 124/125. Furthermore, although only one pair of the airflow openings 124/125 is illustrated, there may be more than one such pair. In some cases, each central bay 119 may have a corresponding pair of the airflow openings 124/125 provided therefore in each central/side separator wall 121. For example, in an implementation in which there are two central bays 119 stacked vertically upon one another with both being defined between a pair of central/side separator walls 121, each of those central/side separator walls 121 may be provided with two pairs of airflow openings 124/125, one pair of airflow openings 124/125 for one of the central bays 119 and one pair of the airflow openings 124/125 for the other one of the central bays 119.

The front airflow opening 124 of a given pair is provided farther forward than the rear airflow opening 125 of the same pair. More specifically, the front airflow opening 124 is positioned so as to be forward of the fans 183 in the system board module 140 when the system board module 140 is installed in the central bay 119, whereas the rear airflow opening 125 is positioned so as to be rearward of the fans 183 in the system board module 140 when the system board module 140 is installed in the central bay 119. Thus, in systems where the fans 183 are arranged to flow air in a front-to-rear direction, the front airflow opening 124 is upstream of the fans 183 and the rear airflow opening 125 is downstream of the fans 183. In systems where the fans 183 are arranged to flow air in a rear-to-front direction, the front airflow opening 124 is downstream of the fans 183 and the rear airflow opening 125 is upstream of the fans 183. In FIG. 1 the front-to-rear airflow direction is illustrated, and in the description below the front-to-rear airflow direction will be focused on for ease of description, but it should be understood that the same principles apply, mutatis mutandis, in systems with a rear-to-front airflow direction except that the relationships described herein would be reversed (e.g., upstream becomes downstream, etc.).

As shown by the dotted-line arrows in FIG. 1, the front airflow opening 124 is configured to allow air to flow from the adjoining side bay 123 into one of the central bays 119. Conversely, the rear airflow opening 125 is configured to allow air to flow from the central bays 119 into the adjoining side bay 123. In particular, when the system board modules 140 is installed in a central bay 119, the fans 183 thereof may be positioned between the front airflow opening 124 and the rear airflow opening 125. Thus, assuming a front-to-rear airflow direction, the fans 183 will create a lower pressure zone in the region forward of the fans 183. Because the front airflow opening 124 is in this lower pressure zone, air will be pulled from the side bay 123 through the front airflow opening 124 into the central bay 119. On the other hand, the fans 183 will create a higher pressure zone in the region rearward of the fans 183. Because the rear airflow opening 125 is in this higher pressure zone, air will be pushed from the central bay 119 into the side bay 123 through the rear airflow opening 125.

As shown in FIG. 1, the air which flows into the side bay 123 and into the central bay 119 may first be drawn into the chassis 110 via the front panel 112 in a front-to-rear airflow configuration (in a rear-to-front airflow configuration, the air intake would be the rear panel 114). More specifically, the portions of the front panel 112 and/or the front bay(s) 116 positioned immediately upstream of the side bay 123 may serve as the air intake for airflows which directly enter the side bay 123—these airflows are labeled "A" in FIG. 1. Similarly, the portions of the front panel 112 and/or the front bay(s) 116 positioned immediately upstream of the central bay 119 may serve as the air intake for airflows which directly enter the central bay 119—these airflows are labeled "B" in FIG. 1. The front airflow opening 124 allows some or all of the airflows A to pass from the side bay 123 into the central bay 119. In this manner, the effective air intake area of the central bay 119 is increased relative to what it would be without the front airflow opening 124. Without the front airflow opening 124, the air intake area of the central bay 119 corresponds to only those portions of the front panel 112/front bays 116 which is directly upstream of the central bay 119, but with the front airflow opening 124 the effective intake area is increased to also include the portions of the front panel 112/front bays 116 directly in front of the side bay 123. Thus, more air can be moved through the central bays 119 per unit of fan speed.

Before the airflows A exit the side bay 123, they pass through a front portion of the side bay 123. Thus, any heat generating components of the side module 150 that are located in this front portion may be cooled by the airflows A. Furthermore, the airflows labeled "C" in FIG. 1 which move from the central bay 119 into the side bay 123 via the rear airflow opening 125 may travel through a rear portion of the side bay 123. Thus any heat generating components of the side module 150 that are located in this rear portion may be cooled by the airflows C. In some examples, the heat generating components of the side module 150 are concentrated in the front and rear portions of the side module 150 such that the airflows A and C can cool these components.

As noted above, in some examples the side module 150 may comprise front and rear airflow openings 154 and 155. These openings 154/155 may be provided in those cases in which the side module 150 would otherwise block the airflow openings 124/125 and inhibit the airflows A and C from passing therethrough. For example, in some cases, a PCB of the side module 150 may be positioned adjacent the central/side separator wall 121, in which case front and rear airflow openings 154 and 155 may be formed in the PCB at locations aligned front and rear airflow openings 124 and 125 so that the PCB does not block airflow through the openings 124/125. As another example, in some cases, the side module 150 may have its own module housing which may include a wall which would be positioned adjacent the central/side separator wall 121, in which case front and rear airflow openings 154 and 155 may be formed in the wall of the module housing at locations aligned front and rear airflow openings 124 and 125 so that the module housing does not block airflow through the openings 124/125.

As shown in FIG. 1, in some examples, each of the airflow openings 124/125 may be provided with a corresponding sliding door to selectively open or close the openings 124/125. Specifically, each front airflow opening 124 may be provided with a sliding door 131 and each rear airflow opening 125 may be provided with a sliding door 132. The sliding doors 131 and 132 are movably coupled to the central/side separator wall 121 via a track 126 or 127, respectively.

The sliding door 131 can slide along the track 126 between open and closed positions. The open position is a forward-most position of the sliding door 131, whereas the closed position is a rear-most position of the sliding door 131. In the open position, the sliding door 131 does not block the front airflow opening 124. In the closed position, the sliding door 131 substantially blocks the front airflow opening 124. The door striker 146 of the system board module 140 may be configured to engage with the sliding door 131 during insertion of the system board module 140 into the central bay 119 and push the sliding door forward into the open position. The door striker 146 of the system board module 140 may also be configured to engage with the sliding door 131 during removal of the system board module 140 from the central bay 119 and pull the sliding door 131 rearward into the closed position. In this manner, the front airflow opening 124 can be automatically (passively) opened and closed through insertion or removal of the system board module 140.

Similarly, the sliding door 132 can slide along the track 127 between open and closed positions. The open position is a forward-most position of the sliding door 132, whereas the closed position is a rear-most position of the sliding door 132. In the open position, the sliding door 132 does not block the rear airflow opening 125. In the closed position, the sliding door 132 substantially blocks the front airflow opening 125. The door striker 145 of the system board module 140 may be configured to engage with the sliding door 132 during insertion of the system board module 140 into the central bay 119 and push the sliding door 132 forward into the open position. The door striker 145 of the system board module 140 may also be configured to engage with the sliding door 132 during removal of the system board module 140 from the central bay 119 and pull the sliding door 132 rearward into the closed position. In this manner, the rear airflow opening 125 can be automatically (passively) opened and close through insertion or removal of the system board module 140.

Turning now to FIGS. 2-15, an example implementation of the system 100 will be described. Specifically, FIGS. 2-15 illustrated an information processing system 200, which is one example implementation of the system 100. In FIGS. 2-15, components of the system 200 which correspond to (i.e., are example implementations of) components of the system 100 will be given similar reference numbers having the same last two digits, such as 120 and 220. Descriptions of components of the system 100 above also may apply to the corresponding components of the system 200, and thus duplicative description of aspects already described above may be omitted below, with the description focusing on aspects of the system 200 which have not heretofore been described.

Figure 3:
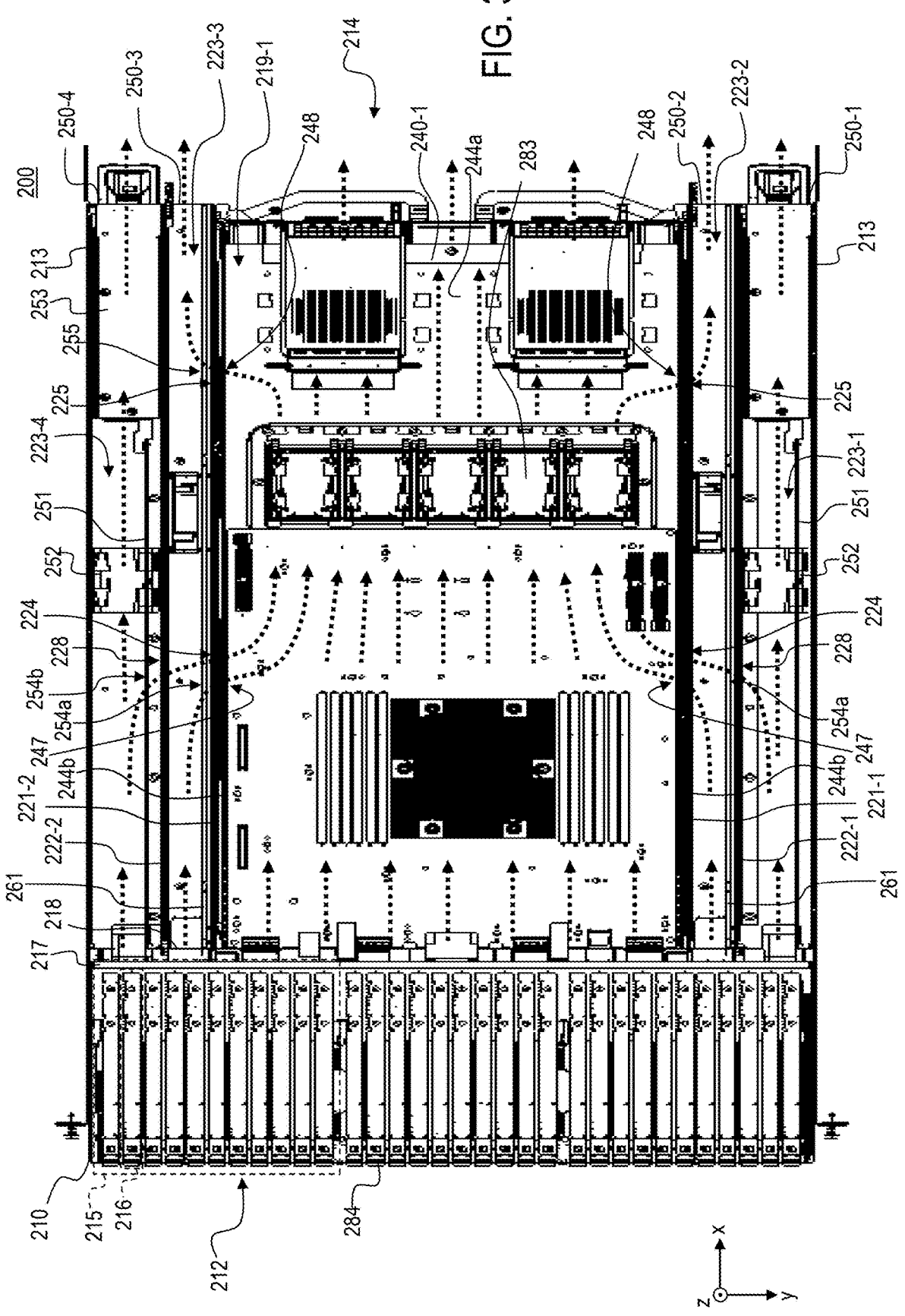
FIG. 3 is a top plan view of the system of FIG. 2 with chassis cover and cage covers omitted.
Figure 4:
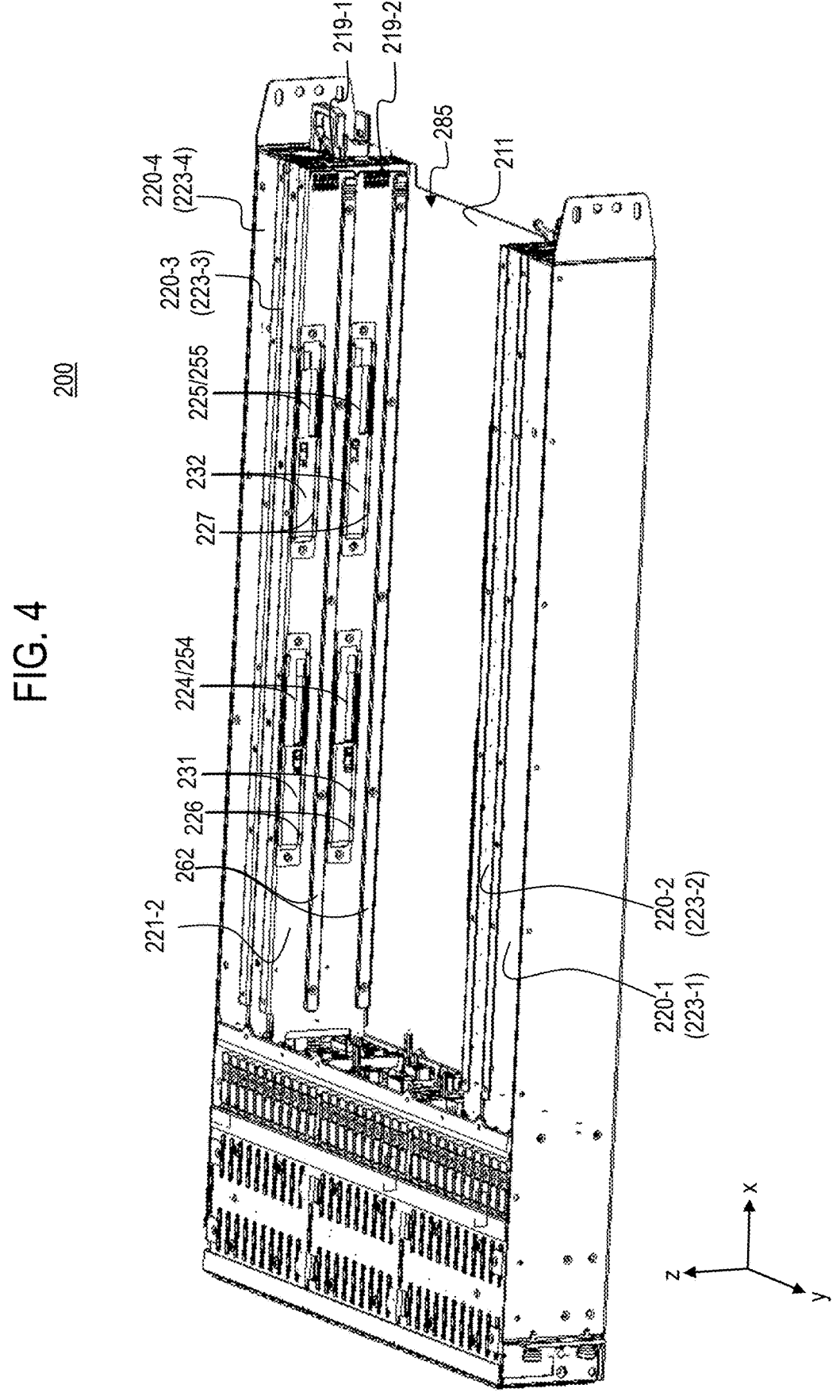
FIG. 4 is a perspective view of the system of FIG. 2 with system board modules removed.

In this example, the system 200 is a server which has IOMs and RMM modules. For example, the system 200 may be a data-storage focused server. As shown in FIGS. 2-4, the system 200 comprises a chassis 210, two central modules 240-1 and 240-2, four side modules 250-1, 250-2, 250-3, and 250-4, and a number of front modules 284. These will be described in turn below The chassis 210 is one example implementation of the chassis 110. As shown in FIG. 4, the chassis 210 comprises a base 211. As shown in FIGS. 2 and 3, the chassis 210 also comprises a front panel 212, a rear panel 214, and two side walls 213 which are all vertically oriented and coupled perpendicularly to the base 211. The chassis 210 also comprises a removable top cover, which is omitted in the drawings to allow the internal portions of the system 200 to be seen.

As shown in FIG. 2, the chassis 210 also comprises a number of front module cages 215 adjacent to or forming part of the front panel 212. Only one front module cage 215 is labeled in FIG. 2, but three are present in this example. As shown in FIG. 3, each front module cage 215 defines a number of front bays 216, each of which may receive a pluggable front module 284. In this example, the front modules 284 may include storage drives. A backplane/midplane 217 is disposed at the rear side of the front module cages 215. The backplane/midplane 217 comprises a substrate (e.g., a PCB) which has connectors mounted to a front side thereof which are complementary to the connectors of the front modules 284, with each of these connectors being aligned with one of the front bays 216 so as to blind-mate with the connector of a front module 284 inserted into the front bay 216. In addition, connectors 218 may be disposed on a rear side of the backplane/midplane 217 which are arranged to mate with complementary connectors of the side modules 250 and the system board modules 240 inserted into the side bays 223 and central bays 219, respectively.

As shown in FIG. 2-4, the chassis 210 also comprises four side module bays 223 and two central bays 219. The side module bays 223 are each configured to receive a corresponding side module 250, while the central bays 219 are each configured to receive a corresponding system board module 240. As shown in FIG. 4, the two central bays 219-1 and 219-2 are stacked vertically atop one another within a central volume 285 of the chassis 210, and the side bays 223 are arranged in two groups of two disposed on opposite lateral sides of this central volume 285. The central volume 285 and each of the side bays 223 extends in the front-to-rear direction from the backplane/midplane 217 to the rear panel 214.

The chassis 210 comprises side module cages 220-1, 220-2, 220-3, and 220-4 which define the side bays 223 and the central bays 219. Each side module cage 220 contains one of the side bays 223. Specifically, first and second side module cages 220-1 and 220-2, which comprise first and second side module bays 223-1 and 223-2, respectively, are arranged together on one lateral side of the central bays 119, with the first side bay 223-1 being adjacent the side wall 213 and the second side bay 223-2 being disposed between the first side bay 223-1 and the central bays 119. Third and fourth side module cages 220-3 and 220-4, which comprise third and fourth side module bays 223-3 and 223-4, respectively, are arranged together on the opposite lateral side of the central bays 119, with the fourth side bay 223-4 being adjacent the side wall 213 and the third side bay 223-3 being disposed between the central bays 119 and the fourth side bay 223-4.

Each side module cage 220 may include a vertical separator wall and a horizontal top wall coupled perpendicularly to the vertical separator wall. As shown in FIG. 3, the vertical separator walls of the side module cages 220 include (moving from bottom to top in FIG. 3): (1) a first side/side separator wall 222-1 which separates a first side bay 223-1 from a second side bay 223-2; (2) a first central/side separator wall 221-1 which separates the second side bay 223-2 from the central bays 119; (3) a second central/side separator wall 221-2 which separates the central bays 119 from a third side bay 223-3; and a second side/side separator wall 222-2 which separates the third side bay 223-1 from a fourth side bay 223-4.

The central bays 219, on the other hand, are not separated from one another by divider walls in this example. Instead, the central bays 219 correspond to two portions of the volume 285 which are reserved for separate system board modules 240. Although not physically separated, the two central bays 219 may be conceptually separated from one another by the rails 262. The rails 262 engage with the system board modules 240 as they are inserted into the bays 219 to guide the modules 240 into the bays and to support the modules 240. A top set of rails 262 engages with a top system board module 240-1 inserted into the top central bay 219-1, while a bottom set of rails 262 engages with a bottom system board module 240-2 inserted into a bottom central bay 219-2.

As shown in FIG. 4, the central/side separator walls 221 each comprise two pairs of airflow openings 224/225, with each pair comprising a front airflow opening 224 and a rear airflow opening 225. One of the pairs of airflow openings 224/225 is disposed in a first central bay 219-1, while the other one of the pairs of airflow openings 224/225 is disposed in a second central bay 219-2. Each of these airflow openings 224/225 has a sliding door 231/232, which is movably coupled to the wall 221 via a track 226. These will be described in greater detail below. Although only the central/side separator walls 221-2 is visible in FIG. 4, it should be understood that the central/side separator walls 221-1 has the same configuration mirrored across a longitudinal centerline of the chassis 210.

The side/side separator walls 222 each comprise two front airflow openings 228 which are laterally aligned with the front airflow openings 224 in the central/side separator wall 221 (the locations of these openings 228 are indicated by arrow in FIG. 3, but they are not visible in the figures). Unlike the central/side separator walls 221, the side/side separator walls 222 do not have rear airflow openings.

As previously mentioned, the central bays 219 are each configured to receive a system board module 240. As shown in FIGS. 2 and 3, each system board module 240 comprises a system board 242, a group of fans 283, host bus adapters (HBAs) 249, and a tray 244 supporting the other components. In this example, the tray 244 comprises a horizontal base 244a and two vertical side walls 244b extending perpendicularly from the base 244a. The side walls 244b each comprise a pair of airflow openings 247/248, including a front airflow opening 247 aligned with the front airflow opening 224 and a rear airflow opening 248 aligned with the rear airflow opening 225. The system board 242 comprises a motherboard carrying a processor socket in which a processor 243 may be mounted, as well as memory and other components as would be familiar to those of ordinary skill in the art. The fans 283 are disposed between the system board 242 and the HBAs 249. The HBAs 249 may be connected to the system board 242 via cables (not illustrated). The system board 242 also comprises connectors 286 configured to blind-mate with connectors 218 of the backplane/midplane 217. This connection electrically connects the system board 242 to the backplane/midplane 217 so that electrical power and data communications may be communicated between the system board 242 and the backplane/midplane 217.

Figures 5, 6:
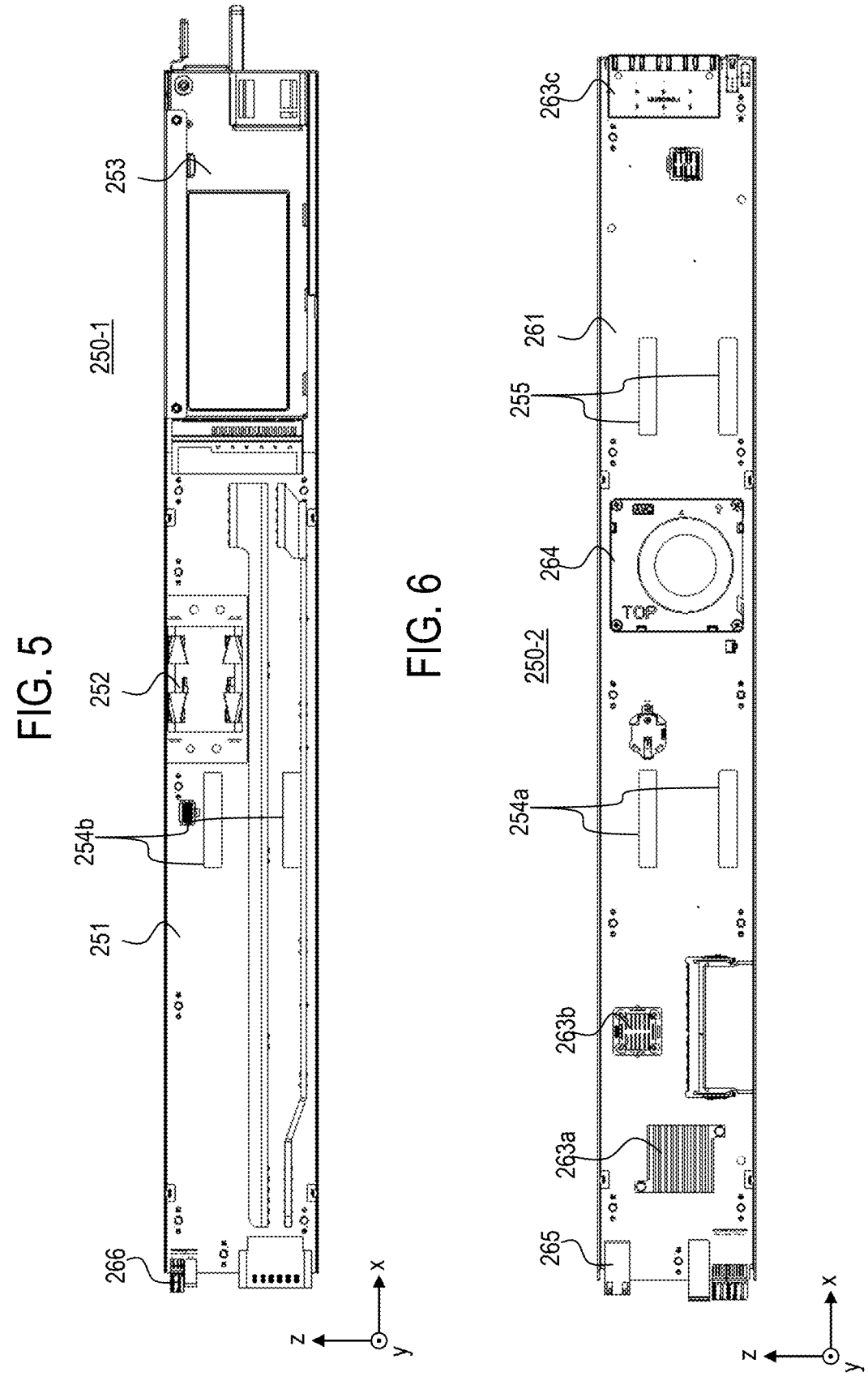
FIG. 5 is a side view of a first side module comprising a PSU module.
FIG. 6 is a side view of a second side module comprising a RMM module.

The first and fourth side bays 223-1 and 223-4 are configured to receive side modules 250-1 and 250-4, respectively. In this example, the side modules 250-1 and 250-4 are PSUs. FIG. 5 illustrates the side module 250-1 as an example. In this example, the side module 250-1 comprises a PCB 251 which is vertically oriented. The PCB 251 has connectors 266 at a front end thereof, which are arranged to blind-mate with corresponding connectors 218 on a rear face of the backplane/midplane 217 when the side module 250-1 is inserted into the side bay 223-1. This connection electrically connects the side module 250-1 to the backplane/midplane 217 so that electrical power and data communications may be communicated between the side module 250-1 and the backplane/midplane 217. The rear end of the PCB 251 may be electrically connected to a PSU 253, which supplies power to the PCB 251 and, ultimately, to the backplane/midplane 217. The PCB 251 comprises two front airflow openings 254*b*, which are arranged to align with the front airflow openings 224. The side module 250-1 may also comprise a fan 252 mounted to the PCB 251.

Although not visible in the figures, in some examples the side modules 250-1 and 250-4 may also comprise a module housing which encloses the aforementioned other parts of the module 250-1 or 250-4. If present, then this housing may comprise front airflow openings in a portion thereof which sits adjacent the wall 222, wherein these front openings are aligned with the front airflow openings 254*b* in the PCB 251 and with front airflow openings 228 in wall 222. These airflow openings are configured similarly to, and serve the same function as, the front airflow openings 254*b* and 228, and thus references herein to how air flows through the airflow openings 254*b* and 228 apply also to these openings of the housing.

The second and third side bays 223-2 and 223-3 are configured to receive side modules 250-2 and 250-3, respectively. In this example, the side modules 250-2 and 250-3 are RMM modules. FIG. 6 illustrates the side module 250-2 as an example. In this example, the side module 250-2 comprises a PCB 261 which is vertically oriented. The PCB 261 has connectors 265 at a front end thereof, which are arranged to blind-mate with corresponding connectors 218 on a rear face of the backplane/midplane 217 when the side module 250-2 is inserted into the side bay 223-2. This connection electrically connects the side module 250-2 to the backplane/midplane 217 so that electrical power and data communications may be communicated between the side module 250-2 and the backplane/midplane 217. The PCB 261 also comprises two front airflow openings 254*a*, which are arranged to align with the front airflow openings 224, and two rear airflow openings 255 which are aligned with the two rear airflow openings 225. The side module 250-2 also comprise various electronic components 263 (e.g., 263*a*, 263*b*, and 263*c*) formed in or mounted to the PCB 261. These components 263 are configured to provide remote monitoring and management capabilities. Some of the components 263, such as components 263*a* and 263*b*, are positioned at a front end of the PCB 261 forward of the front openings 254*a*. Others of the components 263, such as components 263*c*, are positioned at a rear end of the PCB 261 rearward of the rear openings 255. In some examples, the side module 250-2 may also comprise a blower 264 mounted to the PCB 261. The blower 264 may be provided in configurations where is desired to allow the system 200 to operate without the system board modules 240 present, so that the blower 264 can cool the side module 250-2 in the absents of the fans 283 of the system board module 240. However, in other configurations where such operation without the system board modules 240 is not expected, the blower 264 may be omitted.

Although not visible in the figures, in some examples the side modules 250-2 and 250-3 may also comprise a module housing which encloses the aforementioned other parts of the module 250-2 or 250-3. If present, then this housing may comprise front and rear airflow openings in a portion thereof which sits adjacent the wall 221, wherein these openings are aligned with the front and rear airflow openings 254*a* and 255 in the PCB 261 (which are also in alignment with the front and rear openings 224 and 225 in the wall 221). These airflow openings are configured similarly to, and serve the same function as, the front and rear airflow openings 254*a* and 255, and thus references herein to how air flows through the airflow openings 254*a* and 255 apply also to these openings of the housing. The housing, if present, may also contain front airflow openings in a portion thereof that sits adjacent to the wall 222 in alignment with the front airflow openings 228 in the wall 222 (which are also in alignment with the front openings 254*b* in the PCB 251).

Turning back to FIG. 3, airflow patterns through the system 100 will now be described. In FIG. 3, dotted-line arrows illustrated example airflows through the system 100. As shown, the front airflow openings 224, 247, and 254*a* allow air to flow from the side bays 223-2 and 223-3 into the system board module 240-1 and 240-2. Thus, the fans 283 in the system board module 240-1 and 240-2 located in the central bays 219-1 and 219-2 can pull air through the front panel 212 into the side module bays 223-2 and 223-3 and then from the side module bays 223-2 and 223-3 through the front airflow openings 224, 247, and 254*a* into the system board module 240-1 and 240-2. Similarly, the front airflow openings 228 and 254*b* allow some of the air flowing to flow from the side bays 223-1 and 223-4 to flow into the adjacent side bays 223-2 and 223-3, respectively. In addition, the front airflow openings 228 and 254*b* allow air to flow from the side bays 223-1 and 223-4 into the side bays 223-2 and 222-3. Some or all of this airflow can then pass into the central bays 219-1 and 219-2 along with the other airflows in the side bays 223-2 and 222-3.

These airflow from the side modules bays 223 can supplement the other air flowing through the system board modules 240 and help improve the cooling thereof. In addition, this also provides airflows through the front portions of the side bays 223-2 and 223-3, which airflows can pass over the components 263 of the module 250-2 or 250-3 which are located at the front portion thereof, such as components 263*a* and 263*b*, thereby cooling these components 263. These airflows may also be generated by the fans 283 of the modules 240-1 and 240-2 even if the side modules 250-2 and 250-3 lack a fan/blower.

As shown in FIG. 3, the rear airflow openings 225, 248, and 255 allow air to flow from the system board module 240-1 and 240-2 back into the side bays 223-2 and 223-3. Thus, the fans 283 in the system board module 240-1 and 240-2 located in the central bays 219-1 and 219-2 can push air from the central bays 219-1 and 219-2 side module bays 223-2 and 223-3 through the rear airflow openings 225, 248, and 255 into the side bays 223-2 and 223-3.

These airflow from the central bays 219 into the side bays 223-2 and 223-3 can provide airflows through the rear portions of the side bays 223-2 and 223-3, which airflows can pass over the components 263 of the module 250-2 or 250-3 which are located at the rear portion thereof, such as components 263*c*, thereby cooling these components 263. These airflows may also be generated by the fans 283 of the modules 240-1 and 240-2 even if the side modules 250-2 and 250-3 lack a fan/blower.

Thus, the airflow openings described herein can allow for the side modules 250-2 and 250-3 to receive cooling airflows even if their fan/blower is non-operational or omitted entirely. Furthermore, the airflow openings allow for a higher concentration of airflows in a central region of each system board module 240-1 and 240-2, which can help to more efficiently cool the components thereof.

Turning to FIGS. 7-15, the sliding doors 231/232 and their operation will be described in greater detail. The front sliding doors 231 are arranged adjacent to each front airflow opening 224, whereas the rear sliding doors 232 are arranged at the rear airflow opening 225. However, aside from differences in location and a few other differences noted below, the sliding doors 231 and 232 are configured similarly to one another and the front and rear airflow openings 224 and 225 are configured similarly to one another. Therefore, while much of the description below will focus on one front sliding door 231 and the corresponding front airflow opening 224 for ease of understanding, the description also applies, mutatis mutandis, to the other sliding doors 231 and 232 and the other openings 224 and 225.

Figures 7, 8:
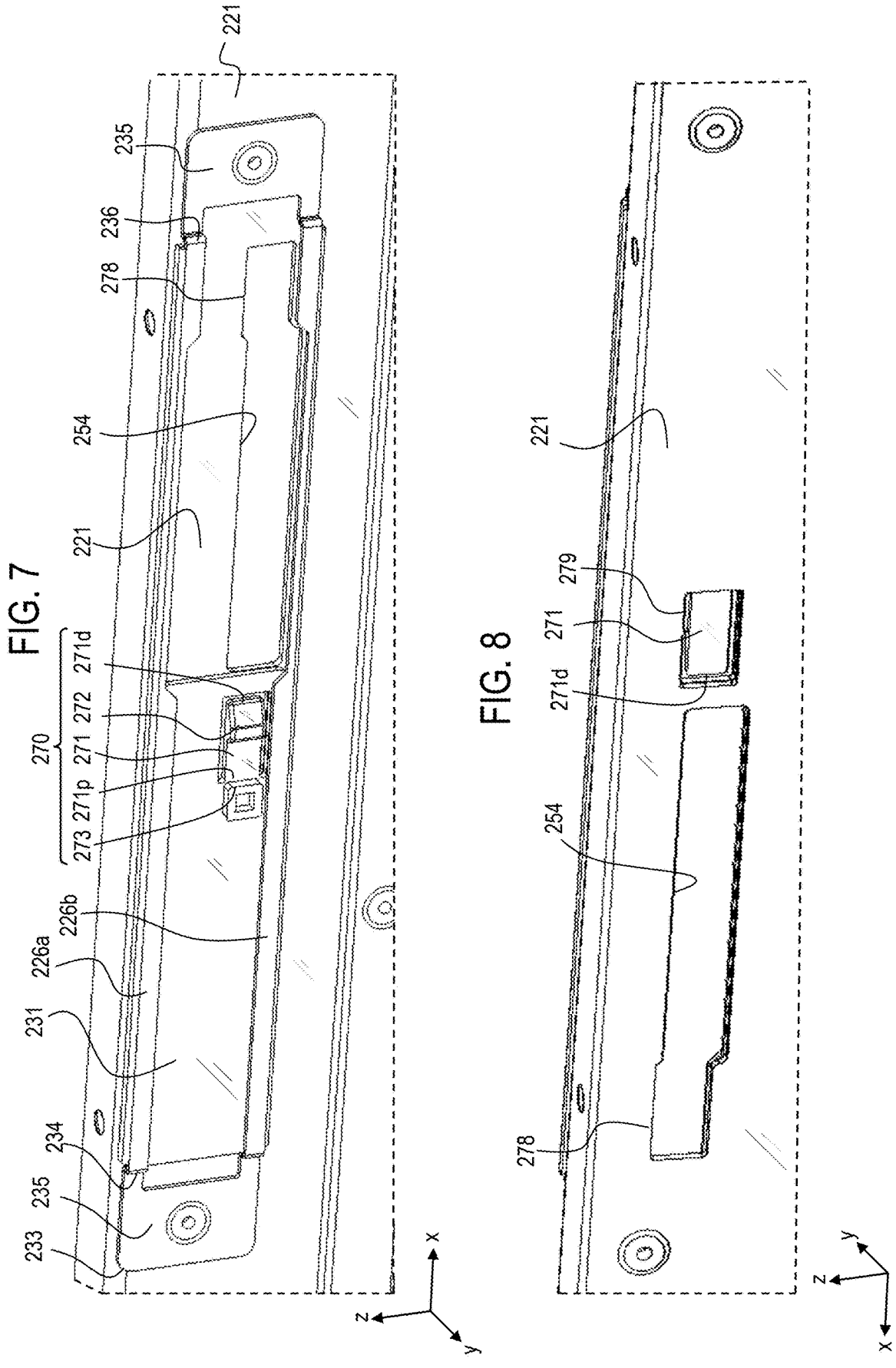
FIG. 7 is a perspective view of a portion of the system of FIG. 2 including a first side of a separator wall and with a sliding door in an open position.
FIG. 8 is a perspective view of the portion of the system of FIG. 7 including a second side of the separator wall and with the sliding door in the open position.

As shown in FIG. 7, in this example the front opening 254 through the wall 221 has the general shape of an elongated rectangle. A door bracket 233 is attached to the wall 221 surrounding the opening 254. The door bracket 233 comprises two attachment portions 235 at opposite ends thereof and two tracks 226a and 226b extending between the attachment portions 235. The attachment portions 235 comprise vertical flanges which are attached to the wall 221 via fasteners such rivets, screws, etc. The tracks 226a and 226b each comprise a channel or trough extending parallel to the front-rear direction (x-axis in the figures) which receives an edge of the door 231. The track 226a is positioned higher than the track 226b, with the track 226a receiving the top edge of the door 231 and the track 226b receiving the bottom edge. The tracks 226 may loosely contain the door 231 such that the door 231 can slide relatively freely along the tracks 226 but while still securely attaching the door 231 to the wall 221. The tracks 226 each have a forward stop 234 and a rearward stop 236 which constrain the sliding movement of the door 231 to a predetermined range. As the door 231 is moved forward, it will eventually collide with the forward stop 234, which prevents any further forward movement beyond that point. As the door 231 is moved rearward, it will eventually collide with the rearward stop 234, which prevents any further rearward movement beyond that point.

Figures 12, 13, 14:
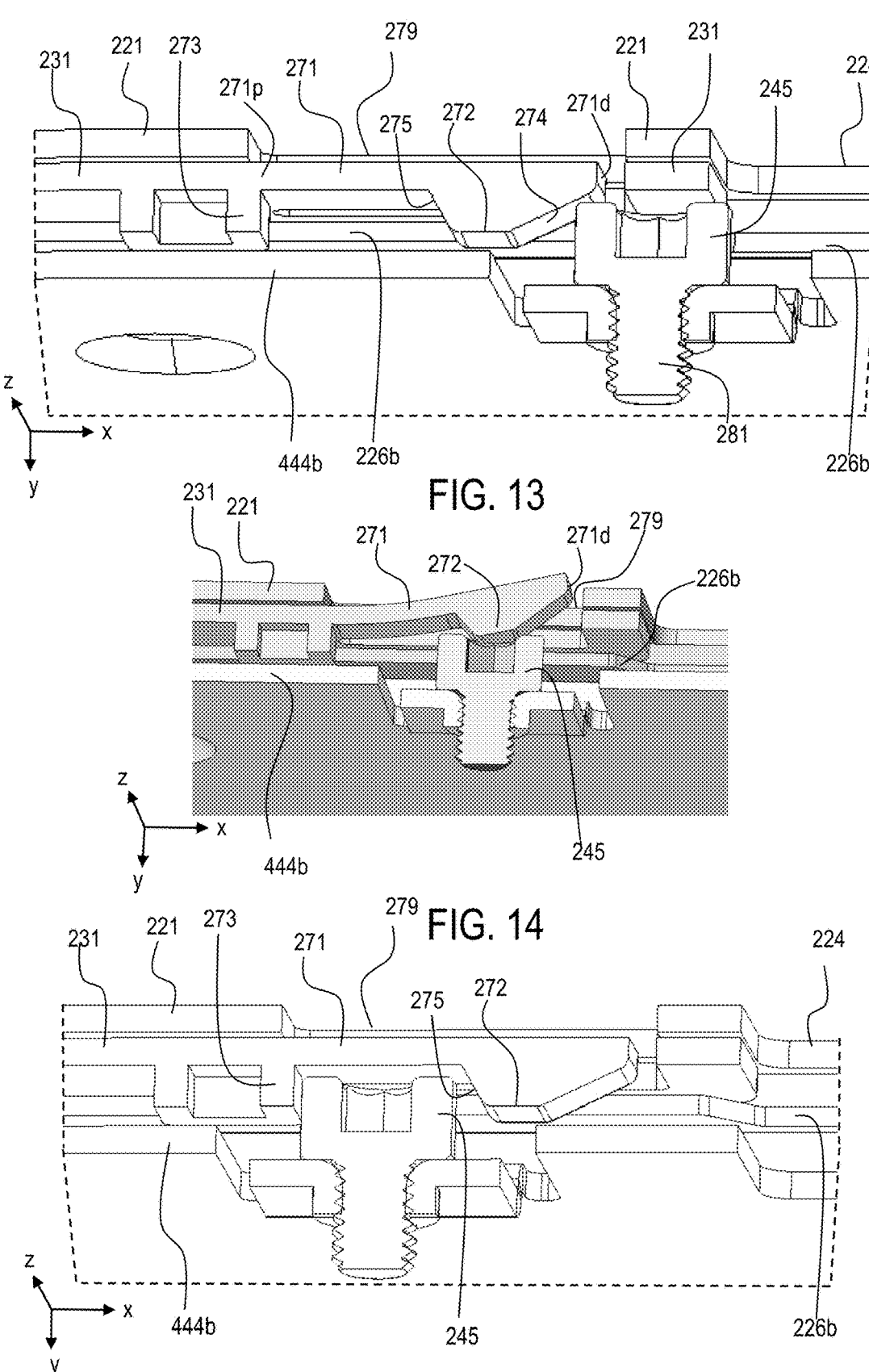
FIG. 12 is a perspective view a portion of the system of FIG. 2 showing a striker of the system board module and a self-release latch in a first state.
FIG. 13 is a perspective view the portion of the system of FIG. 12 showing the striker and the self-release latch in a second state.
FIG. 14 is a perspective view the portion of the system of FIG. 12 showing the striker and the self-release latch in a third state.

As shown in FIG. 7, the door 231 also comprise a self-release latch 270. The self-release latch comprises a cantilevered arm 271 which has an attached proximal end 271p which is attached to the remainder of the door 231 and a free distal end 271d opposite from the proximal end 271p. Cutouts surround three sides of the arm 271 such that only the proximal end 271p thereof is directly attached to the remainder of the door 231. The arm 271 is configured to be elastically bendable with the free distal end 271d being deflected towards or away from the wall 221 (i.e., in the +/−y-axis directions in the figures). The latch 270 also comprises a latching protrusion 272 formed in the arm 271 near the distal end 271d thereof. As shown in FIG. 12, the latching protrusion 272 has a sloped forward edge 274 and a sloped rearward edge 275. The self-release latch 270 also comprises a stop 273 adjacent to the proximal end 271p of the arm 271.

The latching protrusion 272 of the latch 270 is arranged to be contacted by a striker 245 attached to the system board module 240 as the system board module 240 is inserted into the corresponding central bay 219. This contact moves the door 231 along the tracks 226 between an open position and a closed position.

FIGS. 7 and 8 illustrate the door 231 in the open position. In this position, the door 231 is at its forward-most extent of travel and the airflow opening 254 is substantially open, allowing air to flow therethrough. Furthermore, as shown in FIG. 8, the arm 271 is positioned over a relief cutout 279, the purpose of which will be described in more detail below.

Figures 9, 10:
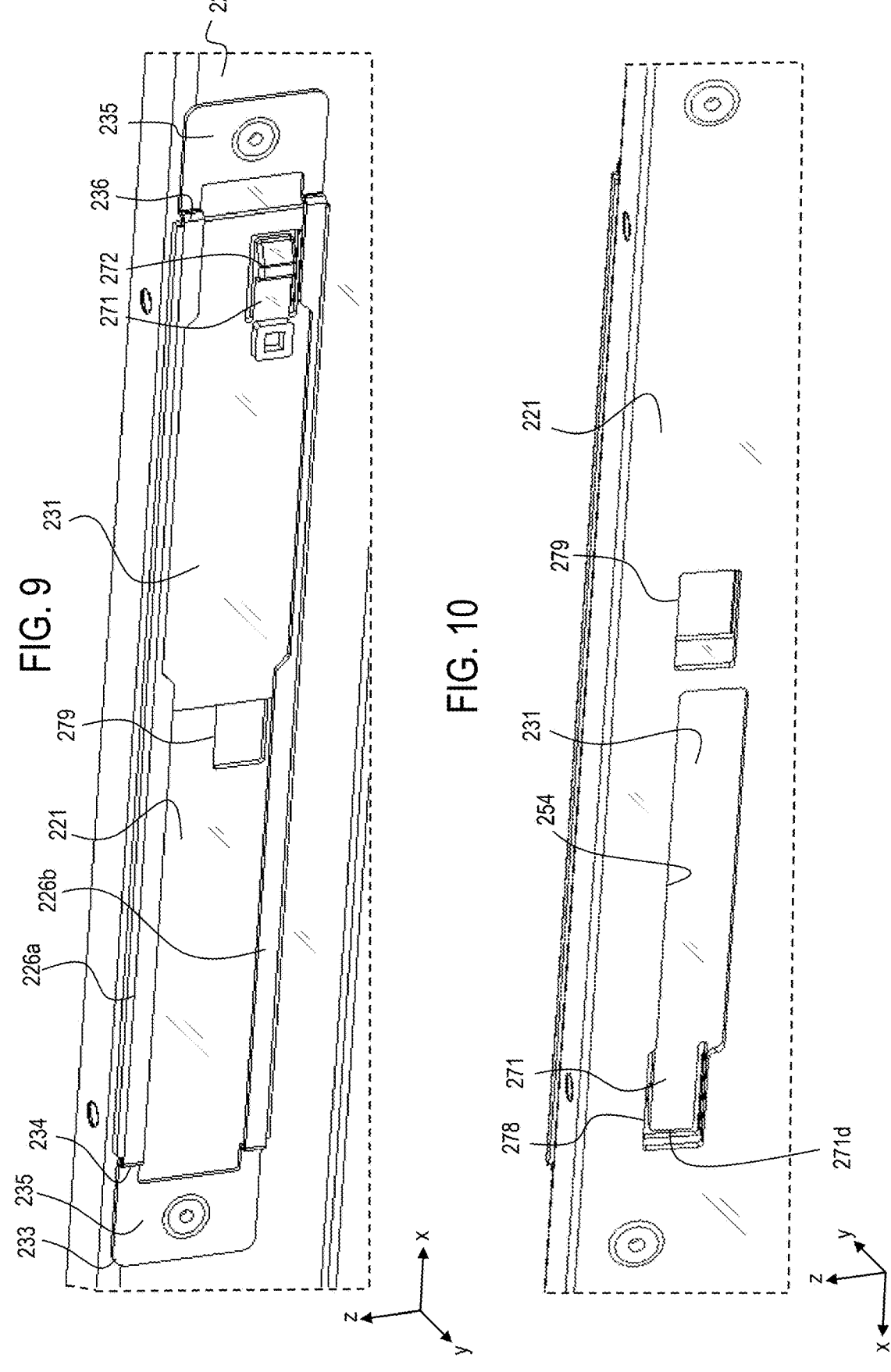
FIG. 9 is a perspective view of the portion of the system of FIG. 7 including the first side of the separator wall and with the sliding door in a closed position.
FIG. 10 is a perspective view of the portion of the system of FIG. 7 including the second side of the separator wall and with the sliding door in the closed position.
Figure 11:
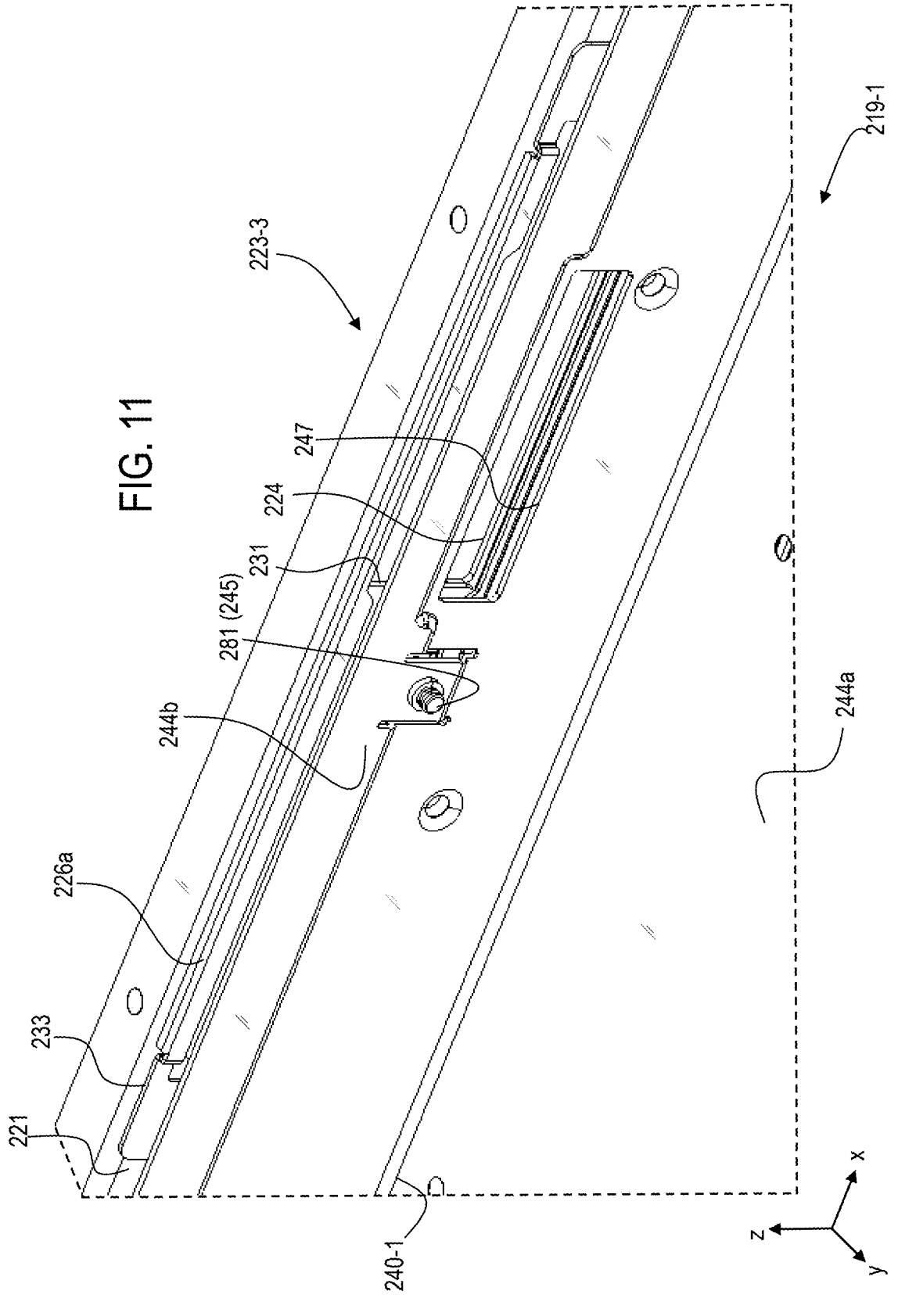
FIG. 11 is a perspective view of the portion of the system of FIG. 7 with a tray of a system board module added.

FIGS. 9 and 10 illustrate the door 231 in the closed position. In this position, the door 231 is at its rear-most extent of travel and the airflow opening 254 is substantially closed, substantially preventing air to flow therethrough. Furthermore, as shown in FIG. 10, the arm 271 is positioned over a relief cutout 278, the purpose of which will be described in more detail below. Note that in this state, the door 231 does not necessarily cover the relief cutout 279. However, the relief cutout 279 does not necessarily allow for significant amounts of airflow therethrough in this state because the relief cutout 279 can be covered by other structures (not illustrated), such as a module housing of the side module 250-2 or 250-3 (if such a housing is present) and/or a PCB 261 of the side module 250-2 or 250-3.

As shown in FIGS. 11-14, a striker 245 may be attached to a side wall 244b of the tray 244 of the system board module 240. The striker 245 comprises a structure which protrudes laterally outward from the tray side wall 244b at a position where the striker 245 can engage with a corresponding latch 270 of a door 231 or 232 to actuate the door 231 or 232. In this example the striker 245 comprises a head of screw 281, but in other examples the striker 245 can be formed from any protrusion protruding outward from the side wall 244b. As shown in FIG. 2, two such strikers 245 may be arranged in the same side wall 244b, with one of the strikers 245 being arranged forward of the other. The forward striker 245 is arranged to engage the front door 231 in the wall 221 of a given bay 219 whereas the rearward striker 245 is arranged to engage the rear door 232 in the same wall 221 in the same bay 219. The opposite side wall 244b (not visible in the figures) also has two such strikers 245. Thus, each module 240 has a total of four strikers 245: two forward strikers 245 (one on each side wall 244b) and two rearward strikers 245 (one on each side wall 244b).

As the system board module 240 is inserted into, or removed from, the central bay 219, the striker 245 will collide with the latching protrusion 272 of the corresponding latch 270.

At a beginning of an insertion sequence of a system board module 240 into the central bay 219, the door 231 will start in the closed (rearward) position and the striker 245 will be located rearward off, and not engaged with, the door 231. As the system board module 240 is inserted, the striker 245 will move in a forward (−x) direction and eventually collide with a rear sloped edge 274 of the latching protrusion 272. Thereafter, continued forward movement of the module 240 into the bay 219 causes the striker 245 to push forward against the rear sloped edge 274, which forces the door 231 to move forward along with the striker 245. Eventually, just before the system board module 240 reaches its fully installed (forward most) position, the door 231 will reach its forward most (open) position and the door 231 will collide with the forward stops 234 of the tracks 226, which stops the forward motion of the door 231. This state is illustrated in FIG. 12. Thereafter, the system board module 240 continues moving forward, as it has not yet reached its forward most position, and accordingly the striker 245 will be forced to move forward relative to the (now stationary) protrusion 272. This forces the latch arm 271 to deflect (elastically bend) laterally outward to make way for the striker 245. In other words, the striker 245 pushes the distal end 271d of the latch arm 271 laterally outward (towards the wall 221), deflecting the arm 271, as shown in FIG. 13. The slope of the edge 274 helps ensure this deflection occurs relatively easily and smoothly without excessively increasing the amount of force a user needs to supply to insert the module 240. Once the striker 245 has moved past the protrusion 272, the latch arm 271 snaps back into its resting position due to the internal spring forces generated by deflecting the arm 271, as shown in FIG. 14. At this point, the system board module 240 has reached its fully installed (forward most) position, and the door 231 is also at its open (forward most) position.

Note that, in the sequence described above, when the striker 245 first collides with the protrusion 272, the striker 245 does not necessarily deflect the latch arm 271 and move past the latching protrusion 272 at that time because door 231 can move relatively freely along the tracks 226. The force needed to deflect the latch arm 271 may exceed the resistance of the door 231 to sliding, and therefore the door 231 may slide along with the striker 245 rather than deflecting, that is until the door 231 reaches the forward stops 234, whereupon the only option become deflection of the latch arm 271. However, in some circumstances, it could occur that the resistance of the door 231 to sliding is sufficiently high that the latch arm 271 might deflect prior to door 231 reaching the forward stops 234. Thus, to ensure that the door 231 is moved into the open position even in the event of this occurring, the latch 270 includes a stop 273 forward of the arm 271. If the striker 245 moves past the protrusion 272 before the door 231 is in the fully open (forward) position, the striker 245 will collide with the stop 273 and thus the striker 245 can continue to push the door 231 into the open position by pushing against the stop 273.

At a beginning of a removal sequence of a system board module 240 from the central bay 219, the door 231 will start in the open (forward most) position, with the striker 245 positioned between the latching protrusion 272 and the stop 273, i.e., the state illustrated in FIG. 14. As the system board module 240 is removed from the central bay 219, the striker 245 will move in rearward (+x direction) and push against a front sloped edge 275 of the latching protrusion 272, which forces the door 231 to move rearward along with the striker 245. Eventually, the door 231 will reach its rearward most (closed) position and the door 231 will collide with the rearward stops 236 of the tracks 226, which stops the rearward motion of the door 231. Thereafter, the system board module 240 continues moving rearward, and accordingly the striker 245 will be forced to move rearward relative to the (now stationary) protrusion 272, which forces the latch arm 271 to deflect (elastically bend) laterally outward to make way for the striker 245. In other words, the striker 245 pushes the distal end 271d of the latch arm 271 laterally outward (towards the wall 221), deflecting the arm 271, in a similar manner as is shown in FIG. 13. Once the striker 245 has moved past the protrusion 272, the latch arm 271 snaps back into its resting position due to the internal spring forces generated by deflecting the arm 271. Thereafter, the striker 245 is fully disengaged from the latch 270, the door 231 is at its closed (rearmost) position, and the system board module 240 can continue being removed from the bay 219.

The slope of the edge 275 is steeper than that of the edge 274. This results in the striker 245 being able to, during the removal sequence, apply a greater amount of force to the edge 275 before the arm 271 will deflect, as compared to the amount of force that the striker 245 can apply to the edge 274 during an insertion sequence before the arm 271 will deflect. When the striker 245 pushes rearward against the edge 275, the slope of the edge 275 coverts the pushing into two force components: a rearward force component pushing the protrusion 272 rearward (in the +x direction in the figures) and a lateral force component pushing the protrusion laterally (in the −y direction in the figures). The rearward force component is what causes the door 231 to slide, whereas the lateral force component is what causes the arm 271 to deflect. If the rearward force component exceeds the frictional resistance to the sliding of the door 231 while the lateral force component is less than the internal resistance of the arm 271 to bending, then the door 231 will slide rather than the arm 271 deflecting. On the other hand, if the rearward force component is less than the frictional resistance to the sliding of the door 231 while the lateral force component exceeds the internal resistance of the arm 271 to bending, then the arm 271 deflects rather than the door 231 sliding. The relative magnitudes of the rearward and lateral force components depends on the slope of the surface 275, with a steeper slope resulting in a larger rearward force component and a smaller lateral force component. Thus, by providing the surface 275 with a steeper slope, it can be ensured that the rearward force component will be sufficiently large and the lateral force component sufficiently small such that the door 231 will slide without the arm 271 deflecting under all reasonably anticipated operating conditions.

One reason for desiring the door 231 to slide along with the striker 245 rather than the arm 271 deflecting early (i.e., prior to the door 231 reaching the fully closed position) is that if the arm 271 deflects early, then the striker 245 may move past and disengage from the latch 270 before the door 231 has reached its closed position. If the striker 245 moves past the latch 270, it will stop pushing the door 231 rearward, and therefore the door 231 may remain in whatever position it was in when the arm 271 deflected. Because the arm 271 deflected early, this position of the door 231 is not the closed position, and therefore the opening 254 will be left at least partially open after the module 240 is removed. This is undesirable because the opening 254 is supposed to be closed when the module 240 is removed, to avoid recirculation of air as described above.

Early deflection of the arm 271 during insertion of the modules 240 is not a problem because the stop 273 is present forward of the latch arm 271 to ensure that the door 231 still reaches the fully open position notwithstanding an early deflection of the latch arm 271. But no such stop is present for the removal process because such a stop could interfere with the removal of the module 240. In other words, the striker 245 needs to be able to fully disengage from the latch 270 eventually so that module 240 can be fully removed, and therefore a stop which prevents that disengagement would not be advisable. Thus, rather than providing a stop which completely prevents disengagement of the striker 245 from the latch 270, the slope of the edge 275 is made steep enough to prevent early deflection of the arm 271 while still allowing the eventual deflection of the arm 271 at the desired place (i.e., when the door 231 is fully closed).

As noted, it is still desired for the arm 271 to be able to deflect once the door 231 has reached the closed position, and therefor the edge 275 is not arranged with a slope that is overly steep, such as perpendicular to the latch arm 271, as this may make it difficult for the striker 245 to move past the latch arm 271. Accordingly, the slope of the edge 275 may be selected so as to strike a balance between providing enough resistance to avoid early deflection of the arm 271 but not so much resistance as to make it difficult for a user to remove the module 240. The optimal slope may vary from one system to the next depending on the materials selected for the latch 270 and striker 245, and their sizes and configurations. The slope of the edge 275 relative to the flat portions of the arm 271 may be about 60 degrees in some examples, or 55-65 degrees in some examples, or 50-70 degrees in some examples. In contrast, the slope of the edge 274 may be about 25 degrees in some examples, or 20-30 degrees in some examples, or 15-35 degrees in other examples.

As explained above, the latch arm 271 is deformed outward (towards the wall 221) when the striker 245 moves past the latching protrusion 272. However, the wall 221 is immediately adjacent to the door 231, and thus without countermeasures the wall 221 might inhibit such deflection.

Thus, to allow the latch arm 271 to deflect, relief cutouts 278 and 279 are provided in the wall 221 to make a space in which the latch arm 271 can extend while being deflected. As shown in FIGS. 8-19, the relief cutout 279 is positioned forward of the opening 254 such that the arm 271 can deflect into the relief cutout 279 when the door 231 is at its farthest forward position at the end of the insertion sequence described above. As shown in FIGS. 7, 8 and 10, the relief cutout 278 is positioned rearward of the opening 254 such that the arm 271 can deflect into the relief cutout 278 when the door 231 is at its farthest rearward position at the end of the removal sequence described above. The relief cutouts 278 and 279 can be formed as openings through the wall 221 which are fully separate from the opening 254 or as openings which are joined with (or form a part of) the opening 254. For instance, in the illustrated example the relief cutout 279 is separate from the opening 254 while the relief cutout 278 is joined with the opening 254, but any other combination of the relief cutouts 278 and 279 being separate from or joined to the opening 254 can be used. Furthermore, although in the illustrated examples, the relief cutouts 278 and 279 are openings which extend fully through the wall 221, in other examples, the relief cutouts 278 and 279 could be formed as recess in the wall 221 which do not necessarily extend fully through the wall 221.

Figure 15:
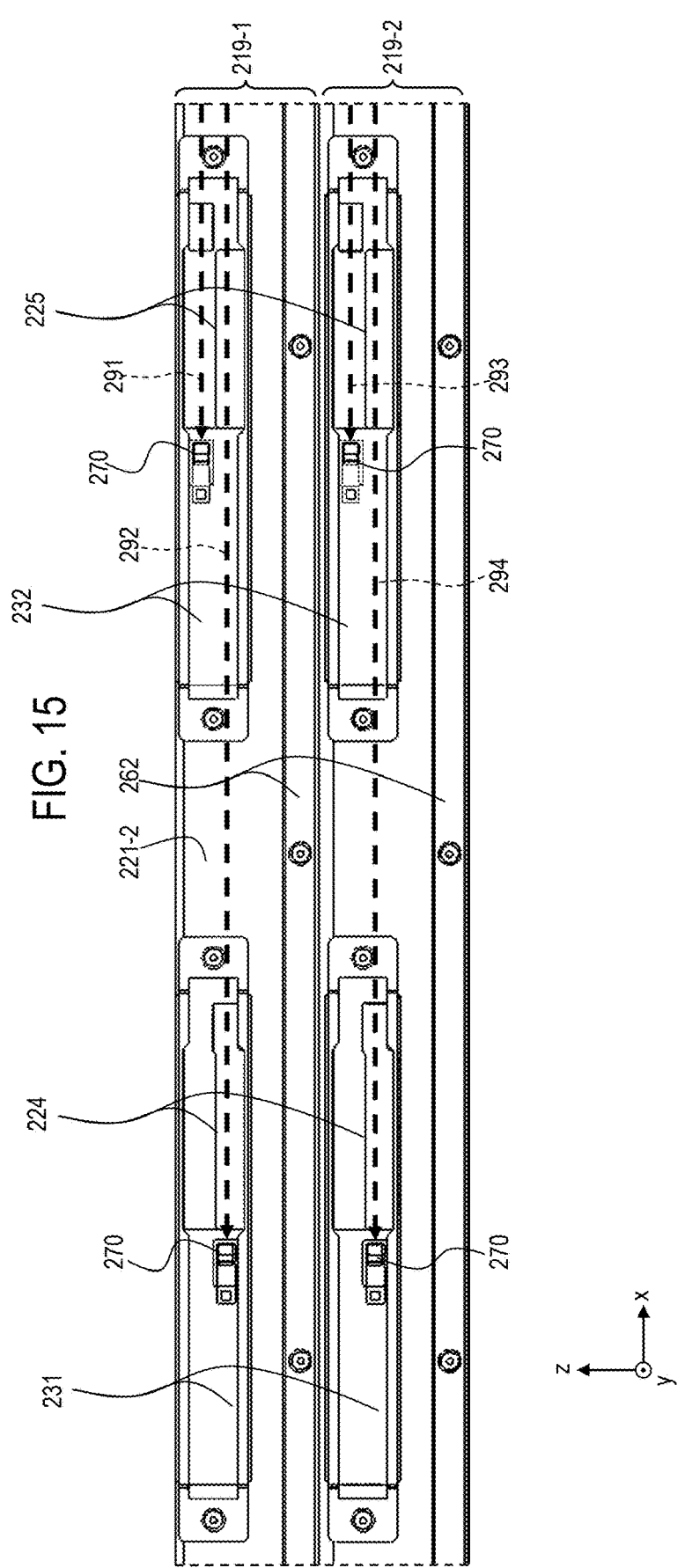
FIG. 15 is a side view of a portion of the system of FIG. 2 showing travel paths of strikers of system board modules in relation to sliding doors.

As mentioned previously, each side wall 244*b* of the module 240 has two strikers 245, a forward striker 245 being configured to engage the latch 270 of the door 231 of the front opening 224 of the bay 219 in which the module 240 is inserted and a rear striker 245 being configured to engage the latch 270 of the door 232 of the rear opening 225 of the same bay 219. FIG. 15 shows how this can be accomplished. As shown in FIG. 15, the latches 270 of the front door 231 and the rear door 232 are positioned at different vertical (z-axis) heights relative to one another. In the illustrated example, the latch 270 of the front door 231 is positioned lower than the latch 270 of the rear door 232, but the opposite relationship could be used in other examples. Similarly, the two strikers 245 disposed on the same side wall 244*b* of the module 240 are also arranged at different vertical heights which correspond to the heights of the latches 270 they are intended to engage with. Thus, the front striker 245 is positioned lower than the rear striker 245. This allows the strikers 245 to engage with the latch 270 they are intended to engage with while bypassing the other latches 270.

For example, as shown in FIG. 15, as a module 240-1 is inserted into the top central bay 219-1, the front striker 245 follows the path 292, passing under the latch 270 of the top-rear door 232 without engaging therewith and then ultimately engaging with the latch 270 of the top-front door 231. The rear striker 245, on the other hand, follows the path 291 and engages with the latch 270 of the top-rear door 232. In some examples, the front and rear strikers 245 may be arranged such that, during insertion into the top-central bay 219-1 the front striker 245 engages the latch 270 of the front door 231 at the same time that the striker 245 engages the latch 270 of the rear door 232. Similarly, as shown in FIG. 15, as a module 240-2 is inserted into the bottom central bay 219-2, the front striker 245 follows the path 294, passing under the latch 270 of the bottom-rear door 232 without engaging therewith and then ultimately engaging with the latch 270 of the bottom-front door 231. The rear striker 245, on the other hand, follows the path 293 and engages with the latch 270 of the bottom-rear door 232. Just as with the top-central bay 219-1, in some examples, the front and rear strikers 245 may be arranged such that, during insertion into the bottom-central bay 219-2, the front striker 245 engages the latch 270 of the front door 231 at the same time that the striker 245 engages the latch 270 of the rear door 232.

Although only one wall 221-2 bounding the bays 219 is shown in FIG. 15, it should be understood that the same or similar arrangement may be used on the opposite wall 221-1, and additional strikers 245 on an opposite side wall 244*b* of the tray 244 may engage with the doors 231/232 thereof in a similar fashion.

"Horizontal" as used herein refers to directions parallel to the base of a chassis of a system (e.g., base 111 or base 211) and/or parallel to a system board of the system (e.g., system board 142 or 242). This includes any directions parallel to x-axis, y-axis, or the x-y plane as illustrated in FIGS. 2-15. "Vertical" refers to directions perpendicular to the base or system board. This includes directions parallel to the z-axis in FIGS. 2-15. "Forward" refers to a horizontal direction pointing from a rear panel towards the front panel of a chassis, such as the −x direction in FIGS. 2-15. "Rearward" refers to a horizontal direction pointing from the front panel towards the rear panel of a chassis, such as the +x direction in FIGS. 2-15. "Lateral" refers to a horizontal direction perpendicular to a forward or rearward direction, or in other words a direction pointing from centerline of the chassis toward a side wall of the chassis, such as the +/−y-directions in FIGS. 2-15. These and other directional/relational terms, such as above, below, etc., should be understood with reference to the orientations illustrated in the drawings and are not intended to refer to external reference frames, such as the ground.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An information processing system, comprising: a chassis comprising a base, a front panel, a rear panel, a first side wall and a second side wall extending between the front and rear panels, a central bay, a side bay disposed between the central bay and the first side wall, and a first separator wall extending parallel to the first side wall and separating the central bay from the side bay; and a system board module configured to be removably received in the central bay, the system board module comprising a system board with a processor mounted thereto, a plurality of fans, and a tray supporting the system board and fans; and a side module configured to be removably received in the side bay, wherein the first separator wall comprises a front airflow opening and a rear airflow opening that fluidically connect the side bay to the central bay.

2. The information processing system of claim 1, wherein the chassis further comprises a front sliding door and a rear sliding door connected to the first separator wall and each movable between a closed position and an open position,
wherein in the closed position the front and rear sliding doors cover the front and rear airflow openings, respectively, and
wherein in the open position the front and rear sliding doors allow airflows through the front and rear airflow openings, respectively.

3. The information processing system of claim 2, wherein front and rear sliding doors are configured to be actuated to move between the closed and open positions by insertion of the system board module into the central bay and by removal of the system board module from the central bay.

4. The information processing system of claim 3, wherein the system board module comprises at least two strikers protruding from the tray and configured to engage with the front and rear doors, respectively, to actuate the front and rear doors during insertion and removal of the system board module from the central bay.

5. The information processing system of claim 4, wherein the front and rear sliding doors each comprise a self-release latch arranged to releasably engage with one of the strikers to actuate the front and rear doors during insertion and removal of the system board module from the central bay.

6. The information processing system of claim 5, wherein the self-release latch comprises a cantilevered lever arm with a latching protrusion, the latching protrusion having a sloped rear surface and a sloped front surface configured to engage with the striker and convert motion of the striker into deflection of the lever arm.

7. The information processing system of claim 2, wherein the front airflow opening is located upstream of the fans in the installed state of the system board module in the central bay, and
wherein the rear airflow opening is located downstream of the fans in the installed state of the system board module in the central bay.

8. The information processing system of claim 2, wherein the side module comprises a printed circuit board (PCB), a second front airflow opening through the PCB configured to be aligned with the front airflow opening of the separator wall in an installed state of the side module in the side bay, and a second rear airflow opening through the PCB configured to be aligned with the rear airflow opening of the separator wall in the installed state of the side module in the side bay.

9. The information processing system of claim 2, wherein the chassis further comprises a second side bay disposed between the side bay and the first side wall, and a second separator wall separating the side bay from the second side bay, and
wherein the second separator wall comprises a second front opening aligned with the front opening of the separator wall.

10. The information processing system of claim 9, Wherein the second side bay is configured to removably receive a power supply unit (PSU) module.

11. The information processing system of claim 1, wherein the chassis further comprises front module cages and a backplane, the front module cages disposed at the front panel and comprising front bays configured to receive pluggable front modules, the backplane disposed at a rear of the front module cages and comprising connectors arranged to connect to the front modules, the side module, and the system board module.

12. The information processing system of claim 11, wherein the central bay and the side bay each extend from the rear panel to the backplane.

13. The information processing system of claim 1, wherein system board module comprises an input-output module (IOM).

14. The information processing system of claim 1, wherein side module comprises a remote monitoring and management (RMM) module.

15. A chassis of an information processing system, comprising: a base; a front panel; a rear panel; a first side wall and a second side wall extending between the front and rear panels; a central volume comprising one or more central bays, each central bay configured to removably receive a system board module; two or more side bays including a first side bay and a second side bay, each of the side bays configured to removably receive a side module, wherein the first side bay is disposed between the first side wall and the central volume, and the second side bay is disposed between the central volume and the second side wall; and first and second separator walls; wherein the first separator wall separates the first side bay from the central volume and comprises one or more pairs of first airflow openings respectively corresponding to the one or more central bays, each pair of first airflow openings fluidically connecting the first side bay to the corresponding central bay, and wherein the second separator wall separates the second side bay from the central volume and comprises one or more pairs of second airflow openings respectively corresponding to the one or more central bays, each pair of second airflow openings fluidically connecting the second side bay to the corresponding central bay.

16. The information processing system of claim 15, wherein each pair of the first airflow openings and each pair of the second airflow openings comprises a front airflow opening and a rear airflow opening, wherein each of the front airflows opening is arranged to be upstream of fans of any of the system board modules installed in any of the central bays.

17. The chassis of claim 15, further comprising:

first sliding doors connected to the first separator wall at respectively corresponding openings of the first airflow openings, each first sliding door configured to be movable between a closed position in which the first sliding door covers the corresponding opening and an open position in which the first sliding door allows airflow through the corresponding opening; and second sliding doors connected to the second separator wall at respectively corresponding openings of the second airflow openings, each second sliding door configured to be movable between a closed position in which the second sliding door covers the corresponding opening and an open position in which the second sliding door allows airflow through the corresponding opening.

18. The chassis of claim 16, wherein first and second sliding doors are configured to be actuated to move between the closed and open positions by insertion of the system board modules into the central bays and by removal of the system board modules from the central bays.

19. The chassis of claim 15, further comprising:

front module cages and a backplane, the front module cages disposed at the front panel and comprising front bays configured to receive pluggable front modules, the backplane disposed at a rear of the front module cages and comprising connectors arranged to connect to the front modules, the side module, and the system board module, wherein the central bays and the side bays each extend from the rear panel to the backplane.

20. The chassis of claim 15, wherein the two or more side bays further include a third side bay and a fourth side bay, the third side bay disposed between the first side wall and the first side bay, the fourth side bay disposed between the second side wall and the second side bay, wherein the chassis further comprises a third separator wall separating the third side bay from the first side bay, and a fourth separator wall separating the second side bay from the fourth side bay, wherein the third separator wall comprise third airflow openings aligned with respectively corresponding ones of the first airflow openings; and wherein the fourth separator wall comprise fourth airflow openings aligned with respectively corresponding ones of the second airflow openings.

* * * * *